United States Patent

[11] 3,567,964

[72] Inventor Hartmut Bleher
Fishkill, N.Y.

[21] Appl. No. 793,782
[22] Filed Jan. 24, 1969
[45] Patented Mar. 2, 1971
[73] Assignee International Standard Electric Corporation
New York, N.Y.
[32] Priority Jan. 27, 1968
[33] Germany
[31] P 16 38 010.2

[54] INTEGRATED CIRCUIT FOR REFERENCE AMPLIFIER
1 Claim, 3 Drawing Figs.

[52] U.S. Cl. .......... 307/303, 317/235, 307/315
[51] Int. Cl. .......... H01l 19/00
[50] Field of Search .......... 317/235/22, 235/22.1, 235/30, 235/29; 307/315, 303; 330/16, 23

[56] References Cited

UNITED STATES PATENTS

| | | | |
|---|---|---|---|
| 3,210,617 | 10/1965 | Kvuper | 307/315 |
| 3,257,621 | 6/1966 | Jadoul | 330/23 |
| 3,300,658 | 1/1967 | Slusher et al. | 330/23 |
| 3,417,210 | 12/1968 | Foster | 317/235 |

FOREIGN PATENTS

| | | | |
|---|---|---|---|
| 1,520,235 | 2/1968 | France | 317/235 |

OTHER REFERENCES

Wireless World, "Transistor Amplifier Output Stages" by Greiter May 1963 pages 234— 36 330/16

Custom Microcircuit Design Handbook " Integrated Circuit Elements - Diodes & Diodes Arrays" Fairchild pages 4— 7, 1964 317/235

*Primary Examiner*—Jerry D. Craig
*Attorneys*—C. Cornell Remsen, Jr., Walter J. Baum, Percy P. Lantzy, Philip M. Bolton, Isidore Togut and Charles L. Johnson, Jr.

ABSTRACT: This is an integrated circuit for reference amplifiers having a plurality of two sets of transistors formed within a semiconductor body with all of the transistors having a common collector region. The first set of transistors have their emitter base junctions forward biased and connected in series. The second set of transistors have their emitter base junctions connected in series and reverse biased so as to operate as zener diodes.

INVENTOR
HARTMUT BLEHER
BY [signature]
ATTORNEY

INTEGRATED CIRCUIT FOR REFERENCE AMPLIFIER

BACKGROUND OF THE INVENTION

This invention relates to integrated circuits for reference amplifiers wherein the improved reference voltage is provided by a zener diode having a higher breakdown voltage and improved temperature compensation.

An integrated circuit for reference amplifiers may have the emitters of two transistor structures of the same type arranged in a semiconductor body serving as the common collector zone, and connected in an electrically conductive manner, wherein the potentials at both the common collector zone and the base zones are chosen so that the emitter-base PN junction of the one transistor structure is biased in the forward direction, and the emitter-base PN junction of the other transistor structure is biased in the reverse direction above its breakdown voltage.

It has been shown that the amplitude of the breakdown voltage of the transistor structure serving as the zener diode is only capable of being selected within narrow limits if, with the aid of the transistor structure acting as the transistor, the temperature coefficient of the total arrangement is supposed to be made as small as possible.

SUMMARY OF THE INVENTION

In accordance with the broadest aspect of this invention an integrated circuit for reference amplifiers has transistor structures whose emitter-base PN junctions are operated in the forward direction as forward diodes, and further transistor structures whose emitter-base PN junctions are operated within the breakdown region as zener diodes, which are arranged within the common semiconductor body, wherein the emitter-base PN junctions of the above transistor structures are electrically connected in series.

According to a further embodiment of the invention, the series resistance of the zener diodes and of the forward-diode series connection, as well as the voltage-dividing resistors fixing the base biasing potential of the transistor structure acting as the reference amplifier are arranged in the common semiconductor body in the form of zones or regions of the opposite conductivity type, or on the semiconductor body in the form of resistance layers deposited thereon. The invention will now be explained in detail with reference to FIGS. 1 to 3 of the accompanying drawings, in which:

DESCRIPTION OF THE PREFERRED EMBODIMENT

Figure 1:
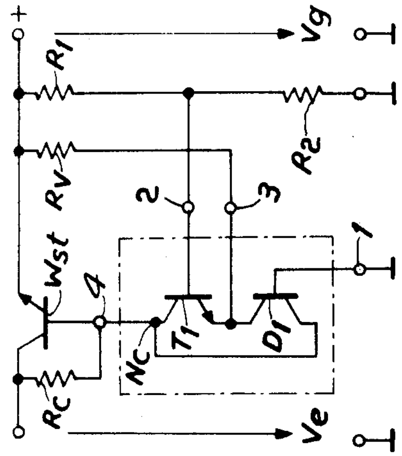
FIG. 1 shows the electrical equivalent circuit diagram of a voltage control circuit having the reversed biased emitter base junction operate as the zener diode setting the reference voltage.

FIG. 1 shows the circuit diagram of a conventional type of voltage control circuit which, at its output, produces the constant voltage $V_g$. The switch symbols shown within the dash line square, indicate the integrated circuit consisting of two transistor structures $T_1$ and $D_1$ arranged within the common collector material $N_c$. The transistor structure $T_1$, in the total circuit, acts as a transistor, i.e. as a reference amplifier stage for the reference voltage generated by the transistor structure $D_1$ as well as for the voltage generated by the voltage divider $R_1$, $R_2$ and which is in proportion to the actual value of the output voltage $V_g$, which is tapped at the center point of the voltage divider and is fed to the base of the transistor structure $T_1$ via the terminal 2. At the collector of transistor $T_1$, and, consequently, simultaneously also at the common collector material $N_c$, and via the terminal 4, there is connected the base of the controlled resistor $W_{st}$ shown in the example of embodiment as a transistor, as well as the resistor $R_c$. Via the resistor $R_r$ and the terminal 3 such a current is applied to the emitter-base PN junction of the transistor structure $D_1$ which is operated in the reverse direction, that this emitter-base PN junction will operate as a zener diode within the breakdown region. The positive temperature coefficient of the transistor structure $D_1$, and the negative temperature coefficient of the emitter-base PN junction of the transistor structure $T_1$ compensate each other mutually, so that the integrated circuit is of the temperature-compensated type. In the event of variations of the input voltage $V_e$ there is varied the voltage as dropping off across the controlled resistor $W_{st}$, so that the output voltage $V_g$ will remain constant. The reference amplifier is provided with the external connecting terminals 1, 2, 3, 4.

The invention now proceeds from the recognition that not only a transistor structure acting as a zener diode can be accommodated in the common collector material $N_c$, but other transistor structures can be inserted therein which are to be connected in series with the base-emitter PN junctions thereof being biased in such a way via the series resistor $R_r$, which are operated with such a current that they all will act as zener diodes within the breakdown region. In this way it is possible not only as in the integrated circuit to obtain a breakdown voltage of about 5 to 7 volts, but a multiple of this value.

Figure 2:
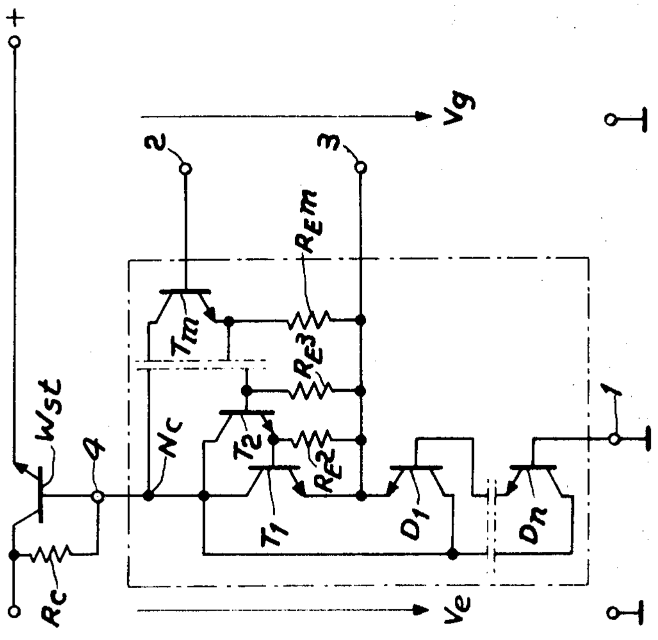
FIG. 2 shows the electrical equivalent circuit diagram of the inventive type of integrated circuit.

In FIG. 2 the series connection of transistor structures acting as zener diodes, and which are all accommodated in the common collector material $N_c$, are indicated by the transistor structures $D_1$ and $D_n$. The separating lines drawn between these two transistor structures, are supposed to illustrate that more than two of such structures can be connected in series. The maximum number of series-connected base-emitter PN junctions which are active as zener diodes, is restricted by the respective base-collector breakdown voltage of the structure. Moreover, the inventive type of integrated circuit, besides the transistor structure $T_1$, still comprises further transistor structures $T_2$ to $T_m$. Also these transistor structures are all inserted in the common collector material $N_c$, or embedded therein. The transistor structures $T_2$ to $T_m$, owing to the negative temperature coefficient of their base-emitter voltage, serve as transistor structures aimed at compensating the enlargement of the positive temperature coefficient which is due to the enlarged number of transistor structures acting as zener diodes. Accordingly, the transistor structures $T_2$ to $T_m$ are operated as forward biased diode structures.

Figure 3:
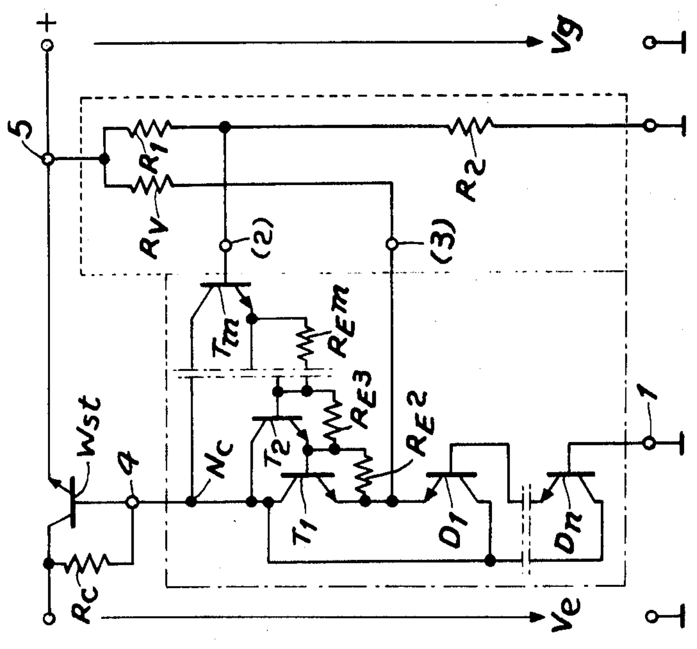
FIG. 3 shows the electrical equivalent circuit diagram of a further embodiment of the inventive type of integrated circuit.

As is evident from the showing of FIG. 3, the voltage-dividing resistors $R_1$ and $R_2$ generating the reference voltage for the transistor $T_1$, and the series resistor $R_r$ which is determinative of the current flowing through the chain of zener diodes, can be inserted into the common collector material $N_c$, in accordance with a further embodiment of the invention, for acting as zones of the opposite conductivity type, or may be deposited on to the semiconductor body in the form of deposited resistance layers. In that case according to the invention, the integrated circuit will only still comprise the external connecting terminals 1, 4 and 5. In other words, when compared with the integrated circuit according to FIG. 1, it is possible to save one external terminal, thus providing e.g. the advantage that this integrated circuit can be accommodated in a normal commercially available three-legged (tripod) transistor casing. Resistor $R_c$, just like in the arrangement according to FIG. 1, is the ohmic resistor of the transistor structure $T_1$. The external connecting point 4 serves to control the control resistor $W_{st}$, i.e., in the example of embodiment according to FIGS. 2 and 3, the base of the shown transistor. According to one advantageous further embodiment of the invention, the effect of the transistor structures $T_2$ to $T_m$ acting as forward diodes, can be improved in that there are inserted the emitter resistors $R_{E2}$ to $R_{Em}$. According to FIG. 3 each of these resistors connects the two emitters of successively following transistor structures of the chain $T_1$ to $T_m$. According to FIG. 2, each of these resistors is arranged between the pole 3, to which the series resistor $R_V$ is connected, and the associated emitter of the corresponding transistor structure, hence e.g. the resistor $R_{E2}$ to the emitter of the transistor structure $T_2$, etc. This arrangement of the emitter resistors $R_{E2}$ to $R_{Em}$ (FIG. 2) which differs from the arrangement according to FIG. 3, has the advantage that the emitter currents of the transistor structures $T_2$ to $T_m$ and, consequently, the temperature compensation are rendered insensitive to the tolerances of the emitter resistors.

By inserting these resistors, and by correspondingly selecting the resistance values of these resistors, it is possible to achieve a fine balancing of the temperature coefficient. Across the control resistor $W_{st}$, in the case of a varying of fluctuating input voltage $V_e$, the voltage varies so that the output voltage $V_a$ will remain constant. In other words, the output voltage $V_a$ is regulated to a constant value.

I claim:

1. A solid-state reference amplifier comprising:

one series of transistors having respective emitter, base and collectors;

another series of transistors having respective emitter, base and collectors, each respective collector of said one series and said another series being directly connected together to form a first circuit terminal, the respective emitters of the first of said one and another series of transistors being connected together, the base of each of said respective one and another series of transistors being connected to the emitter of the next succeeding transistor;

first and second resistors connected together at one respective terminal of each of said first and second resistors, the other terminal of said second resistor being connected to the base of the last of said another series of transistors to form a second circuit terminal, the base of the last of said one series of transistors being connected to said one respective terminal of each of said first and second resistors;

a third resistor connected at one terminal to the emitter of the first of said another series of transistors, the other respective terminals of said first and third resistors being connected together to form a third circuit terminal;

each of one group of resistors connected in series with the emitter of each of said one series of transistors respectively; and signal means applied between said second and third circuit terminals to forward bias the emitter base diode of each of said one series of transistors, and to reverse bias the emitter base diode of each of said another series of transistors beyond the zener breakdown voltage of each transistor of said another series, the emitter base diode of each of said another series of transistors having a zener breakdown voltage between 5 to 7 volts and a positive temperature coefficient, each of said one series of transistors having a negative temperature coefficient, the number of transistors of said another series being selected to provide a required reference voltage below the collector base breakdown voltage of each of said one and another series, the number of transistors of said one series being selected to provide adequate temperature compensation for said reference amplifier.